US009634668B2

(12) United States Patent
Das (10) Patent No.: US 9,634,668 B2
(45) Date of Patent: Apr. 25, 2017

(54) PIPELINING OF CLOCK GUIDED LOGIC USING LATCHES

(71) Applicant: Ashutosh Kumar Das, Cupertino, CA (US)

(72) Inventor: Ashutosh Kumar Das, Cupertino, CA (US)

(73) Assignee: Picogem Corporation, Cupertino, CA (US)

( * ) Notice: Subject to any disclaimer, the term of this patent is extended or adjusted under 35 U.S.C. 154(b) by 0 days.

(21) Appl. No.: 14/217,388

(22) Filed: Mar. 17, 2014

(65) Prior Publication Data

US 2014/0266303 A1 Sep. 18, 2014

Related U.S. Application Data

(60) Provisional application No. 61/802,132, filed on Mar. 15, 2013.

(51) Int. Cl.
*H03K 19/096* (2006.01)

(52) U.S. Cl.
CPC .................. *H03K 19/096* (2013.01)

(58) Field of Classification Search
CPC .............................. H03K 19/096; H04L 25/026
USPC ..................................................... 326/93, 113
See application file for complete search history.

(56) References Cited

U.S. PATENT DOCUMENTS

| | | | | | |
|---|---|---|---|---|---|
| 5,434,520 | A * | 7/1995 | Yetter | ................... | G06F 7/5016 326/93 |
| 5,645,555 | A * | 7/1997 | Davis | ................... | A61B 5/1411 606/182 |
| 5,886,540 | A * | 3/1999 | Perez | ............... | H03K 19/01728 326/93 |
| 6,118,304 | A * | 9/2000 | Potter | ..................... | G06F 1/08 326/93 |
| 6,331,800 | B1 * | 12/2001 | Radjassamy | ............ | H01L 22/22 257/E21.526 |
| 6,462,582 | B1 * | 10/2002 | Forbes | .................. | H04L 25/026 326/113 |
| 7,724,036 | B2 * | 5/2010 | Das | ...................... | H03K 19/096 326/93 |
| 2014/0253175 | A1 * | 9/2014 | Dally | .................. | H03K 19/096 326/93 |

* cited by examiner

*Primary Examiner* — Albert Wong
(74) *Attorney, Agent, or Firm* — Willink & Hunt LLP; Marcus T. Hunt (57) ABSTRACT

This application discloses the technique to pipeline the Clock Guided Logic. Latch based storage elements are used in CGL based design such that when first stage CGL elements are in precharge phase the second stage CGL elements are in evaluate phase and vice-versa resulting into higher design throughput.

18 Claims, 6 Drawing Sheets

PIPELINING OF CLOCK GUIDED LOGIC USING LATCHES

CROSS REFERENCE TO RELATED APPLICATION

The present patent application claims the benefit of, and incorporates by reference, the corresponding U.S. provisional patent application Ser. No. 61/802,132, entitled, "Method and Apparatus of Pipelining the Clock Guided Logic" filed on Mar. 15, 2013.

FIELD OF THE INVENTION

The invention relates to integrated circuits, and more specifically to optimization of integrated circuits.

BACKGROUND OF THE INVENTION

Figure 1:
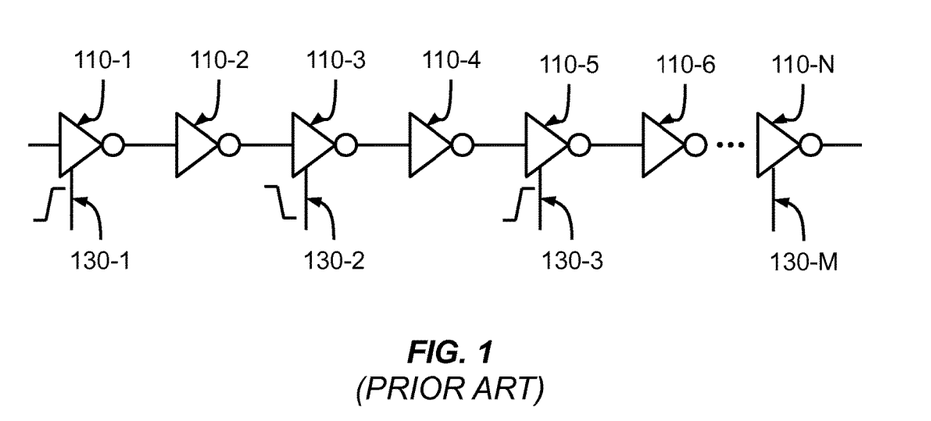
FIG. 1 illustrates an example circuit showing prior art Clock Guided Logic design.

It is desirable to pipe-line the logic in an integrated circuit (IC) for improving the bandwidth of the operation and enable faster clocking of the design. Pipeline of a given logical operation comprises of storage elements called flip-flops that hold value for a full clock cycle or latches that hold value for half clock cycle to store intermediate results. Latches are used in pair per clock cycle stage to hold the information during positive and negative half of a clock cycle. These results are used in next clock cycle by subsequent stages. Pipe-lining an operation reduces the time for each stage of operation and helps improve the clock frequency of the design. This application described the technique of pipe-lining the Clock Guided Logic (CGL) gates using latches. FIG. 1 shows an example circuit constructed as per the teachings of prior art Clock Guided Logic. In FIG. 1, gates 110-1, 110-2, 110-3, 110-4, 110-5, 110-6, and so on, 110-N are CGL elements. In FIG. 1 gates 110-1 and 110-5 EVH type gates; gate 110-3 is an EVL type gate and gates 110-2, 110-4, 110-6 are REG type gates. The example circuit shown in FIG. 1 uses guide signals 130-1, 130-2, 130-3, and so on, 130-M to drive the evaluate and pre-charge phases of the Clock Guided Logic. Guide signals 130-1 and 130-3 drive an EVH type gate while guide signal 130-2 drives an EVL type gate as shown in the CGL example in FIG. 1. The technique described in this application utilizes latching elements to store the intermediate evaluated values of certain nodes of the CGL design while the corresponding CGL circuits that drive the nodes undergo pre-charge phase The latch based pipe-lining technique of this application allows a continuous flow of data to be fed to the inputs of the Clock Guided Logic designs every clock cycle for evaluation thereby increasing the throughput of the pipe-lined design. The art of Clock Guided Logic is described in U.S. Pat. Nos. 7,724,036 B2 and 8,102,189 B2 and description of the prior art Clock Guided Logic technique is incorporated in this application by reference.

BRIEF DESCRIPTION OF THE DRAWINGS

A better understanding of at least certain embodiments of the invention can be obtained from the following detailed description in conjunction with the following drawings, in which.

DETAILED DESCRIPTION

A novel technique to pipe-line Clock Guided Logic is described as per the teachings of this application. The diagrams included as part of this application are exemplary and are merely to help in the description of the pipe-line technique presented in this application. The examples presented in this application are not meant to limit the scope this application in anyway and anyone skilled in the art can use the examples to understand and be able to utilize the technique presented in this application.

Figure 2:
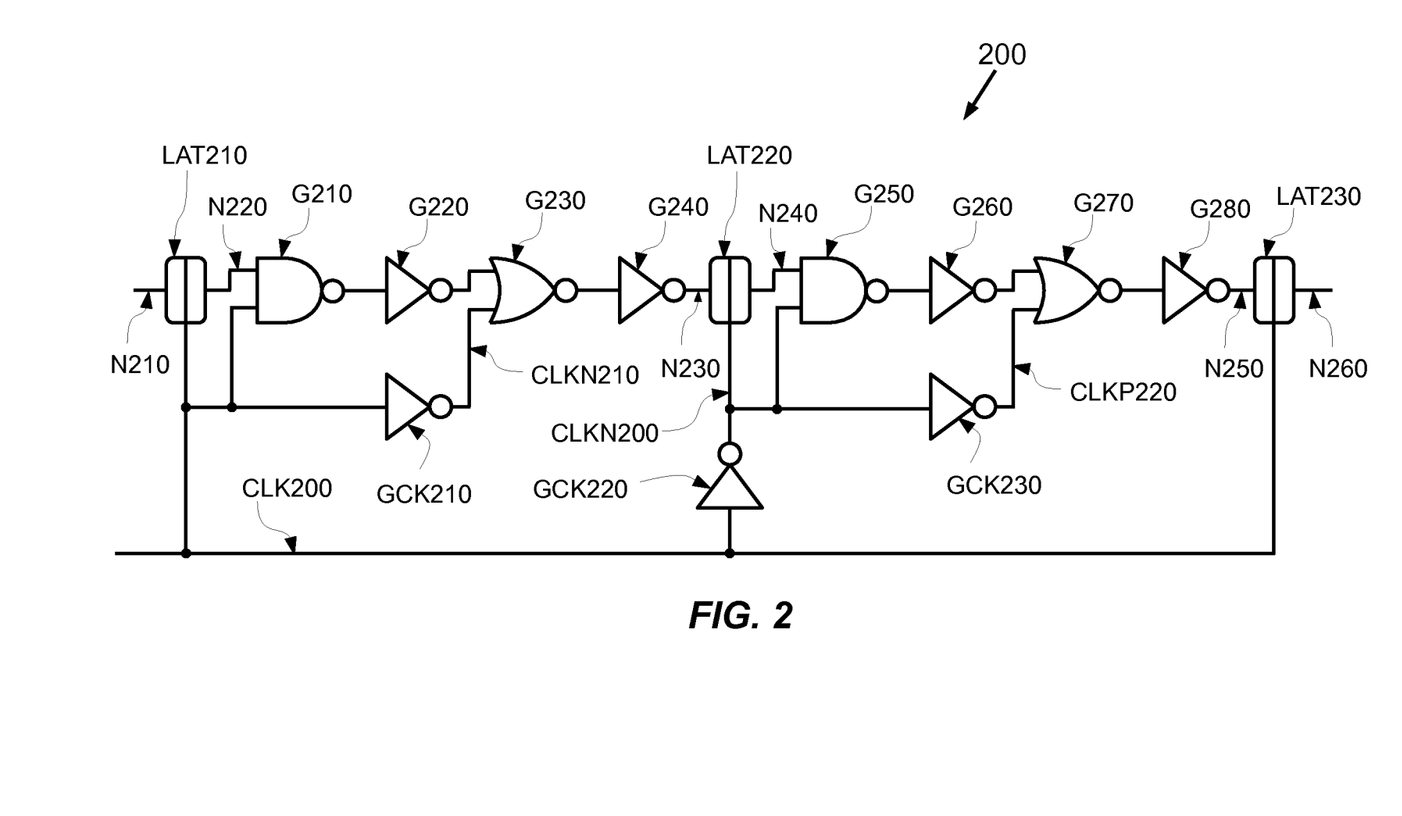
FIG. 2 illustrates an example circuit schematic that shows pipe-lining of the Clock Guided Logic.

FIG. 2 shows an example of pipe-lining the Clock Guided Logic (CGL) using latches as per the teachings of this application. Gates LAT210, LAT220, and LAT230 shown in FIG. 2 are latches. In FIG. 2 latch LAT210 input, output, and clock nodes are connected respectively to signals N210, N220, and CLK200. Also, as shown in FIG. 2 latch LAT210 input, output, and clock nodes are connected respectively to signals N230, N240, and CLKN200. Similarly, Latch LAT230 input, output, and clock nodes are connected respectively to signals N250, N260, and CLK200. These latches let the input value pass through to the output when their respective clock inputs are at logical zero or low and maintain the value of the output regardless of any change in input value when their clock inputs are at logical one or high. Therefore, latches LAT210 and LAT230 in FIG. 2 will let values at their inputs (connected to signals N210 and N250 respectively) pass to their outputs (connected to signals N220 and N260 respectively) if their clock inputs (connected to the same clock signal CLK200) are at logical zero. Furthermore, latches LAT210 and LAT230 will maintain the values of their corresponding outputs when clock input signal CLK200 is at logical one. Similarly, latch LAT20 will let value at its input (connected to signal N230) pass to its output (connected to signal N240) if its clock input (connected to signal CLKN200) is at logical zero and maintain the value of is output signal N240 when clock signal CLKN200 is at logical one. Moreover in FIG. 2 gates G210, G220, G230, and G240 show CGL gates that are connected between latches LAT210 and LAT220 for pipe-lining. Similarly, gates G250, G260, G270, and G280 show CGL gates are connected between latches LAT220 and LAT230 for pipe-lining. The example scheme shown in FIG. 2 as per the teachings of this application depicts a latch based pipeline in which LAT210 belongs to a previous pipe-line stage and LAT220 and LAT230 belong to current pipe-line stage.

Next the functioning of the example design presented in FIG. 2 is described in this paragraph. In this application, when a latch that is in a state where it lets the input value pass to the output is said to be either open or in an open state. Also when the latch is in a state of maintaining its output value, it is said to be either closed or in a closed state in this application. At the arrival of a positive CLK200 signal in FIG. 2 (i.e., a clock signal that is transitioning from logic zero to logic one) the LAT210 becomes closed and maintains its output value. Therefore, the value of latch LAT210 output signal N220 is unchanged during the positive phase of the CLK200 signal. Also when the CLK200 transitions to positive state the CGL gates G210, G220, G230, and G240 and the associated guide inverter GCK210 undergo evaluation as per the teachings of CGL invention and produce the value of signal N230. It can be seen in FIG. 2, the signal N230 is the input signal for the latch LAT220. It should be noted that in the positive clock phase when the CLK200 signal is high the output signal CLKN200 of the inverter GCK220 is low since a logical one input of an inverter produces a logical zero output. It can be seen in FIG. 2 that the clock signal CLKN200 is the input clock signal of the latch LAT220. Therefore, the latch LAT220 is in open state and allows data value at its input signal N230 to pass to its output signal N240. Next when the CLK200 transitions low the output signal CLKN200 of the inverter GCK220 transitions in an opposite direction to high since a logical zero input of an inverter produces a logical one output. Therefore the LAT220 becomes closed and maintains its output value N240 for negative phase of the clock CLK200. It should be noted that when the CLK200 transitions low the outputs of the CGL gates G210, G220, G230, and G240 start to transition to their pre-charge values and eventually the value of signal N230 also transitions to its pre-charge value as per the teachings of CGL. However, pre-charge of signal N230 does not affect the latch LAT220 output signal N240 since the latch LAT220 is in closed state by then. Further when the clock signal CLKN200 transitions to positive state the CGL gates G250, G260, G270, and G280 and their associated guide inverter GCK230 undergo evaluation as per the teachings of CGL invention and produce the output value of signal N250 based on their input signal N240. As shown in FIG. 2 the signal N250 is the input signal for the latch LAT230. The latch LAT230 is in open state because its clock input CLK200 is at logical zero and therefore allows its input signal N250 to pass to its output N260. Next when the clock signal CLK200 signal to high again the latch LAT230 closes and maintains its output value for the subsequent pipeline stages. Also when the clock signal CLK200 is in high phase the outputs of the gates G250, G260, G270, and G280 undergo pre-charge. However it does not affect the output N260 of latch LAT230 since this latch is closed by then. Therefore, it can be seen in the example shown in FIG. 2 that during positive clock phase when clock CLK200 is at logic high, the first half of CGL gates G210, G220, G230, and G240 undergo evaluation and second half of CGL gates G250, G260, G270, and G280 undergo pre-charge. Similarly, during negative clock phase when clock CLK200 is at logic low, the second half of CGL gates G250, G260, G270, and G280 undergo evaluation and first half of CGL gates G210, G220, G230, and G240 undergo pre-charge. It should also be noted that in FIG. 2 the latch LAT210 is closed during positive clock phase of CLK200 and maintains it output value N220 when first half of CGL gates G210, G220, G230, and G240 are undergoing evaluation. However in FIG. 2 the LAT220 is open during positive half of clock CLK200 allowing the result of first half of CGL gate evaluation to be latched. Similarly, latch LAT220 is closed during negative clock phase of CLK200 and maintains its output value N240 when second half of CGL gates G250, G260, G270, and G280 are undergoing evaluation. However the LAT230 is open during negative half of clock CLK200 allowing the result of second half of CGL gate evaluation to be properly latched. In summary example design shown in FIG. 2 allows the output data during CGL evaluation phase to properly latched and stops the propagation of output data during CGL pre-charge phase. Also this latch based pipeline technique shown by way of example in FIG. 2 ensures correct design operation at different clock frequencies since the data at the pre-charge phase is not allowed to propagate and corresponding output latches hold the output values.

Pipeline Technique Using Latches with Time Borrowing

Figure 3:
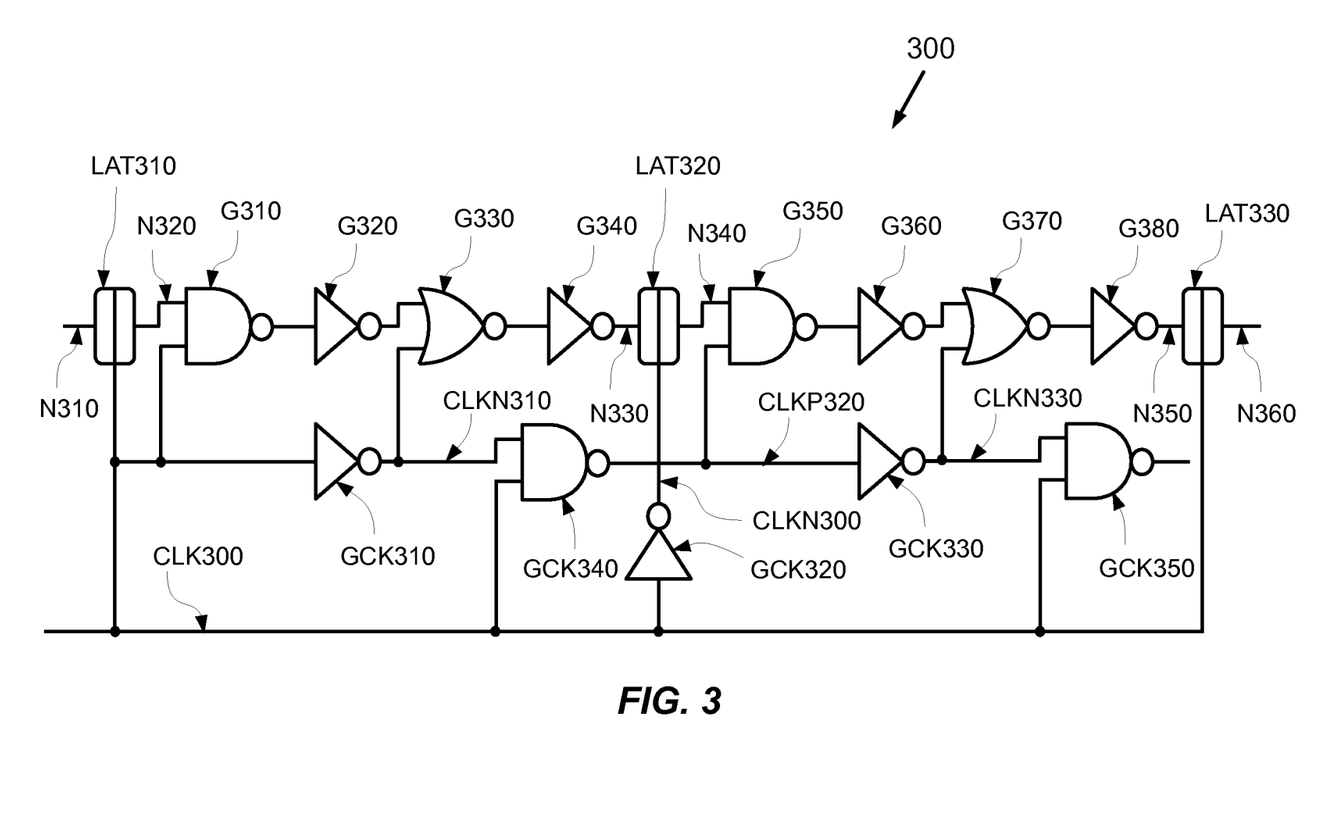
FIG. 3 illustrates an example circuit schematic showing pipe-lining of the Clock Guided Logic with time borrowing.

In a design it is not readily possible to balance the logic delays across different stages and it is common that there are differences in the delays among different stages. In such scenarios the clock can only run as fast as the slowest stage allows. Therefore it is desirable that one stage can borrow timing from other stage in order to better balance the timing delay inequalities among different stages. In this paragraph the pipe-line technique that allows time-borrowing across latches is described as per the teaching of this application. Example diagram shown in FIG. 3 is used to aid in the description of the technique. The example shown in FIG. 3 does not limit the scope this application and the technique can be applied on other designs by a person skilled in the art. The diagram of FIG. 3 is similar to the diagram of FIG. 2 with the exception of additional gates GCK340 and GCK350 as shown in FIG. 3. In FIG. 3 the CGL gates G310, G320, G330, and G340 and their associated guide logic cells GCK310 and GCK340 will be referred to as first stage with a delay of DEL1. Similarly the CGL gates G350, G360, G370, and G380 and their associated guide logic cells GCK330 and GCK350 will be referred to as the second stage in FIG. 3 with a delay of DEL2. In the example design shown in FIG. 3 the second stage delay DEL2 is longer than the first stage delay DELL The guide logic gate GCK340 generates the guide clock signal CLKP320 that drives the EVH-type CGL gate G350 of the second stage. The guide logic gate GCK340 uses guide clock CLKN310 and the clock signal CLK300 as its inputs. The guide clock signal CLKN310 drives an EVL-type gate G330 in the first stage as well. The clock signal CLK300 is incoming clock signal to the design 300. Here it should be mentioned that the gate nomenclature of EVL-type and EVH-type is adopted in this application from the CGL technique described in the U.S. Pat. Nos. 7,724,036 B2 and 8,102,189 B2.

Next the working of the example schematic shown in FIG. 3 is described in this paragraph. When the clock CLK300 transitions high the evaluation of the first stage begins and the first stage CGL output signal N330 becomes evaluated after the first stage delay DEL1. It should be noted that the CLK300 signal is in the positive phase during evaluation of first stage logic gates. Moreover the clock input CLKN300 to the latch LAT320 is at logic low when the signal N330 arrives at the input of LAT320 during evaluation phase of the first stage. Therefore, the latch LAT320 is open and allows the signal N330 to propagate to its output N340. It should be noted that the guide gate GCK340 has a logic NAND functionality and its output is logic zero only when both its inputs are at logic one otherwise its output is at logic one value. Next, since the clock CLK300 is at logical one, the CGL guide signal CLKP320 that is driven by the output of the guide gate GCK340 (having a logic NAND functionality) transitions to logical one value when the guide clock CLKN310 that is an input to guide gate GCK340 transitions to logic zero value from logic one value. The guide signal CLKP320 serves as the guide input clock to the second stage CGL gates. In FIG. 3 the latch LAT320 is open during positive half of the clock CLK300. Therefore, the latch LAT320 input signal N330 passes through the latch LAT320 to its output signal N340. The signal N340 drives first CGL gate G350 of the second stage. Therefore, both the data input signal N340 and guide input clock CLKP320 arrive to the second stage without waiting for CLK300 to transition to low phase and the evaluation of the CGL gates in the second stage continues without waiting for the CLK300 to transition to low value in the example shown in FIG. 3. Also, as can be seen in FIG. 3 the signal N340 is data input to the second stage. Now when the CLK300 transitions to a logic zero value the latch LAT320 clock input signal CLKN300 transitions to logic one and makes the LAT320 to go into closed state because latch closes when its clock input transitions to a logic one. This allows the latch LAT320 output signal N340 to remain steady for the negative half phase of the clock CLK300 when the second stage CGL gates G350, G360, G370, and G380 are undergoing evaluation. Concurrently the first stage CGL gates G310, G320, G330, and G340 will undergo pre-charge during negative half phase of the clock CLK300. It should also be noted that now since the clock signal CLK300 is at logical zero value the output CLKP320 of the guide logic gate GCK340 (with a NAND functionality) remains at logic one value even if the CLKN310 signal at the input of the gate GCK340 changes to a logic one value since a NAND gate output is logic one if one of its inputs are at logic zero. Therefore the guide clock input CLKP320 to the second stage once transitioned to logic one value remains unchanged during second stage evaluation phase even if the guide signal input CLKN310 to guide gate GCK340 transitions to a high value as a result of the first stage undergoing a pre-charge cycle. This unhindered propagation of signal across the stages allows the second stage to effectively borrow time from the first stage. In other words if the logic delay of the first stage is less than the logic delay of the second stage the evaluation operation proceeds to the second stage after the first stage evaluation is complete without waiting for clock GCK300 to transition to a low phase. This time borrowing of the second stage from the first stage results in the improvement of the clock frequency as the clock phase timing need not be limited by the second stage delay. In a design a suitable node can be chosen to insert the latch elements such that first stage delay is less than or equal to the second stage delay. This scheme also ensures that the correct polarity of the guide clock signals is propagated and maintained. The guide logic gate GCK350 generates the guide clock for subsequent stage similar to the guide logic gate GCK340 and so forth.

Figure 4:
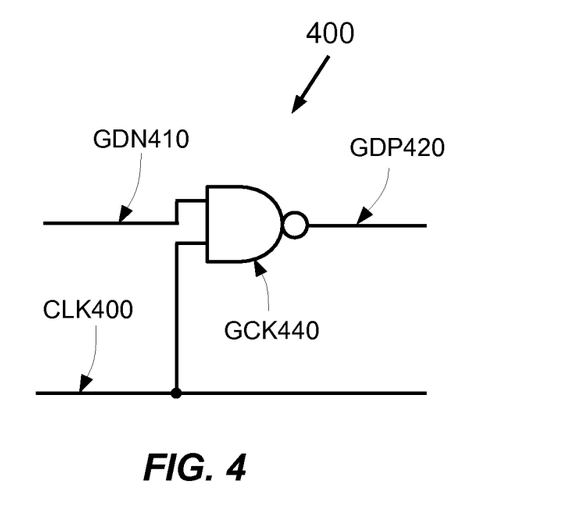
FIG. 4 illustrates guide clock logic to drive an EVH gate in next stage from input guide clock that drives EVL gate.
Figure 5:
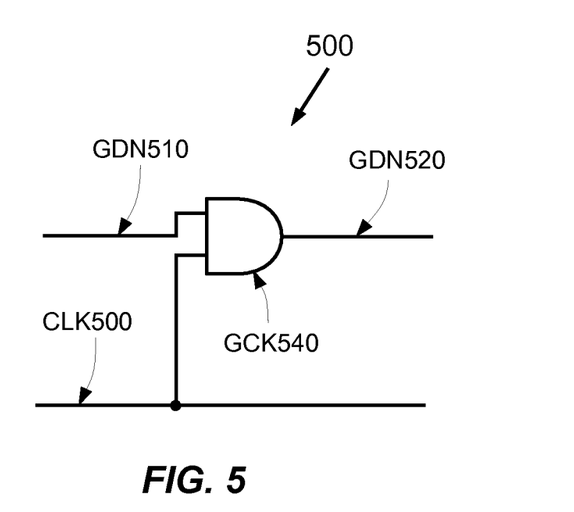
FIG. 5 illustrates guide clock logic to drive an EVL gate in next stage from input guide clock that drives EVL gate.
Figure 6:
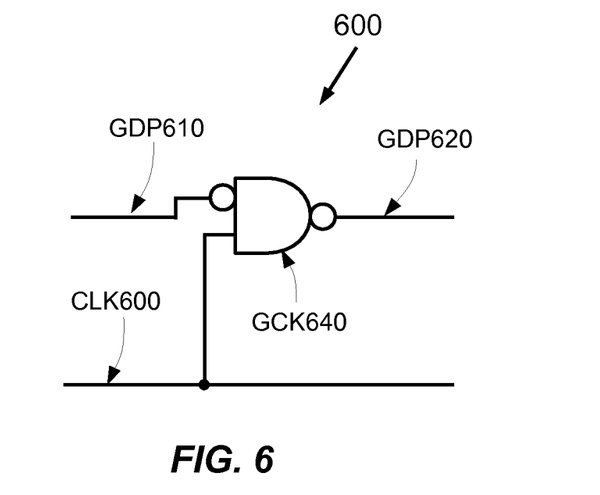
FIG. 6 illustrates guide clock logic to drive an EVH gate in next stage from input guide clock that drives EVH gate.
Figure 7:
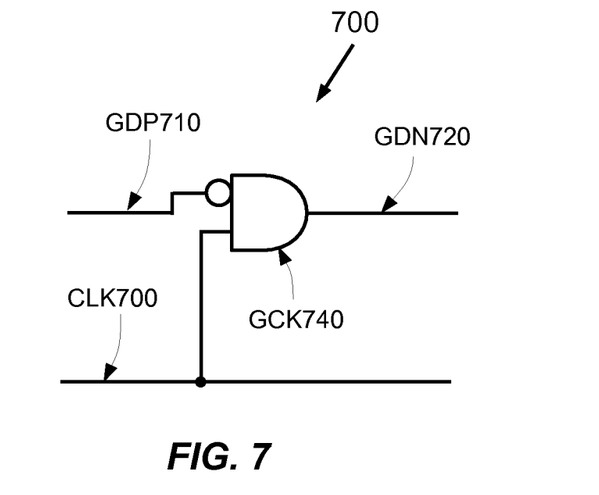
FIG. 7 illustrates guide clock logic to drive an EVH gate in next stage from input guide clock that drives EVL gate.

It should be noted that in the example shown in FIG. 3 the CGL guide gate GCK340 is shown as a NAND gate. The logic functionality of guide logic gate GCK340 (and gate GCK350 and so forth) depend upon the polarity of the input guide signal that is generated by the first stage, the polarity of the output guide signal that needs to be generated for the next stage based on which type of CGL gate (i.e., either an EVH-type or an EVL-type) it drives, and the clock signal CLK300. Various logic function for gate GCK340 for different input and output guide clock polarity are shown in FIG. 4, FIG. 5, FIG. 6, and FIG. 7. In FIGS. 4, 5, 6, and 7 the gates GCK440, GCK540, GCK640, and GCK740 are the guide logic gate respectively that are used for generating their respective guide clock outputs GDP420, GDN520, GDP620, and GDN720 for their respective second stage CGL logic gates corresponding to their respective design clock inputs CLK400, CLK500, CLK600, and CLK700 and respective guide clock inputs GDN410, GDN510, GDP610, and GDP710. The FIG. 4 shows that for an input guide clock GDN410 that has polarity suitable to drive an EVL-type gate and output guide clock GDP420 that needs polarity suitable to drive EVH-type gate the gate GCK440 needs the logic functionality given by boolean equation GDP420=!(GDN410 & CLK400). Similarly, FIG. 5 shows that for an input guide clock GDN510 that has polarity suitable to drive an EVL-type gate and output guide clock GDN520 that needs polarity suitable to drive EVL-type gate the gate GCK540 needs the logic functionality given by boolean equation GDN520=GDN510 & CLK500. Next FIG. 6 shows that for an input guide clock GDP610 that has polarity suitable to drive an EVH-type gate and output guide clock GDP620 that needs polarity suitable to drive EVH-type gate the gate GCK640 needs to have logic functionality given by boolean equation GDP620=!(!GDP610 & CLK600). Lastly FIG. 7 shows that for an input guide clock GDP710 that has polarity suitable to drive an EVH-type gate and output guide clock GDN720 that needs polarity suitable to drive EVL-type gate the gate GCK740 needs a logic functionality given by boolean equation GDN720=!GDP710 & CLK700. In the boolean equations presented in this paragraph the symbol "!" denotes a logical NOT operation and symbol "&" represents a logical AND operation. For other similar scenarios anyone skilled in the art can deduce such functionality of the guide logic element for the correct operation of the design for time borrowing. All such gate functionality are already contemplated as part of this application.

Furthermore, the pattern in which CGL gates and latches alternate can be repeated to form multiple pipe-line stages in pipe-line techniques shown in FIG. 2 and FIG. 3. Consecutive latch stages are alternatively driven by clock signals and inverted clock signals in the example illustrations presented in this application. Further it is possible to merge the CGL gates and latch functionality into a single gate for optimizing the performance of the design in terms of area, power, and frequency of operation. Such modifications to improve design performance are already contemplated as part of this application. Anyone skilled in the art can easily see how the pipeline techniques shown in the examples of FIG. 2 and FIG. 3 can be used in other designs. Finally it is allowed in a design that uses this technique partially to mix regular logic that uses flip-flop based pipe-lining with CGL logic that uses latch based pipelining as per the teachings of this application. Such mixed cases are already contemplated and are part of this application.

Figure 8:
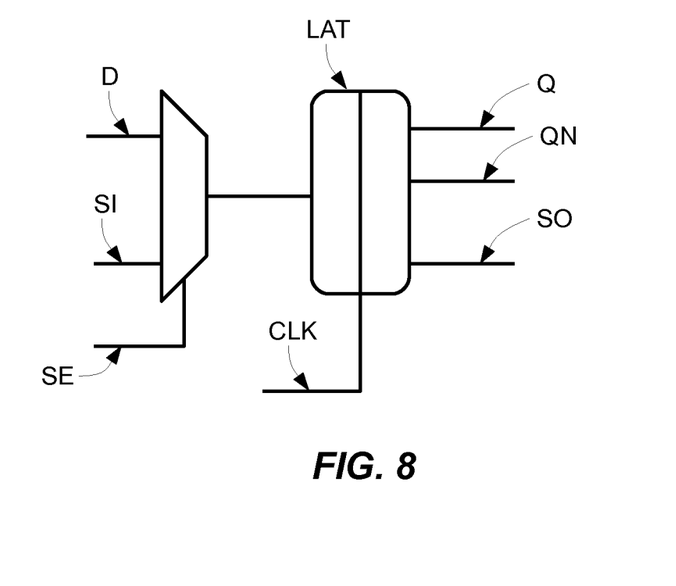
FIG. 8 illustrates a latch that includes scan functionality.

Next it should also be noted that the latches used in the pipe-line technique presented in this application can be modified to incorporate scan functionality (e.g., support for scan chains by including scan-input, scan-output, and scan-enable interfaces in the latches) for supporting design for test (DFT) features. FIG. 8 shows an example schematic implementing scan functionality. In FIG. 8 a latch LAT is shown with a simple multiplexor at its input that selects between scan input SI and functional data input D based on whether the scan-enable is asserted or not respectively. The output of the latch has scan-output SO, data-output Q, and its complimentary data output QN. The SI and SO can be connected in series to form a scan-chain for testability purposes. Also either or both data outputs Q and complimentary data output QN can be used in subsequent stage as needed. There are well known DFT techniques that can readily be utilized for implementing DFT features by a person skilled in the art. All such testability related modifications in the CGL pipeline technique presented in this application is contemplated as part of this application.

For the design of digital integrated circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

The teachings of this description are applicable to every level of integrated circuit design and implementation. The teachings of this description may be implemented at any level of integrated circuit design and implementation including one or more of the following: high-level descriptions such as chip-level or system-level; embedded system level; software subroutine level; mapped netlist level; Register Transfer Logic (RTL) level; Hardware Description Language (HDL) level; schematic level; technology-independent gate level; technology-dependent gate level; circuit floorplan level; and hardware implementation level and etcetera.

Throughout the foregoing specification, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. When a particular feature, structure, or characteristic is described in connection with an embodiment, it is submitted that it is within the knowledge of one skilled in the art to bring about such a feature, structure, or characteristic in connection with other embodiments whether or not explicitly described. Various changes may be made in the structure and embodiments shown herein without departing from the principles of the invention. Further, features of the embodiments shown in various figures may be employed in combination with embodiments shown in other figures.

In the description as set forth above and claims, the terms "coupled" and "connected," along with their derivatives, may be used. It should be understood that these terms are not intended to be synonymous with each other. Rather, in particular embodiments, "connected" is used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some portions of the detailed description as set forth above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion as set forth above, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to apparatus for performing the operations herein. This apparatus may be specially constructed for the required purposes, or it may comprise a general purpose computer selectively activated or reconfigured by a computer program stored in the computer. Such a computer program may be stored or transmitted in a machine-readable medium, such as, but is not limited to, a machine-readable storage medium (e.g., any type of disk including floppy disks, optical disks, CD-ROMs, and magnetic-optical disks, read-only memories (ROMs), random access memories (RAMs), EPROMs, EEPROMs, flash memory, magnetic or optical cards, or any type of media suitable for storing electronic instructions), or a machine-readable transmission medium such as, but not limited to, any type of electrical, optical, acoustical or other form of propagated signals (e.g., carrier waves, infrared signals, digital signals, etc.).

The algorithms and displays presented herein are not inherently related to any particular computer system or other apparatus. Various general purpose systems may be used with programs in accordance with the teachings herein, or it may prove convenient to construct more specialized apparatuses to perform the method operations. The structure for a variety of these systems appears from the description above. In addition, the invention is not described with reference to any particular programming language. It will be appreciated that a variety of programming languages may be used to implement the teachings of the invention as described herein.

Embodiments of the invention may include various operations as set forth above or fewer operations or more operations or operations in an order which is different from the order described herein. The operations may be embodied in machine-executable instructions which cause a general-purpose or special-purpose processor to perform certain operations. Alternatively, these operations may be performed by specific hardware components that contain hardwired logic for performing the operations, or by any combination of programmed computer components and custom hardware components.

Throughout the foregoing description, for the purposes of explanation, numerous specific details were set forth in order to provide a thorough understanding of the invention. It will be apparent, however, to one skilled in the art that the invention may be practiced without some of these specific details. Accordingly, the scope and spirit of the invention should be judged in terms of the claims which follow as well as the legal equivalents thereof.

What is claimed is:

1. A circuit comprising:
   one or more nodes for providing a clock signal;
   a first stage of circuit elements comprising first Clock Guided Logic (CGL) elements in a pipelined configuration from an initial first CGL element to a final first CGL element;
      wherein a first clock path of the first stage is coupled to the one or more nodes to receive the clock signal, the first clock path further coupled to a second input of each first CGL element and configured to provide first guide signals to the second inputs of the first CGL elements to drive the first CGL elements into pre-charge and evaluate phases;
   a second stage of circuit elements comprising second CGL elements in a pipelined configuration from an initial second CGL element to a final second CGL element;
      wherein a second clock path of the second stage is coupled to a second input of each second CGL element and configured to provide second guide signals to the second inputs of the second CGL elements to drive the second CGL elements into pre-charge and evaluate phases;
   a first latch coupled to the first stage such that an input of the first stage is coupled to a data output of the first latch;
      wherein a third clock path is coupled to the one or more nodes to receive the clock signal, the third clock path further coupled to a first clock input of the first latch and configured to provide the clock signal to the first clock input to open and close the first latch, the first latch configured to open during a first phase of the clock signal and to close during a second phase of the clock signal;
   a second latch coupled to the first stage and to the second stage such that an output of the first stage is coupled to a data input of the second latch, and such that a data output of the second latch is coupled to an input of the second stage;
      wherein a fourth clock path is coupled to the one or more nodes to receive the clock signal, the fourth clock path further coupled to a second clock input of the second latch and configured to provide an input clock signal to the second clock input to open and close the second latch, the input clock signal having an inverted relationship with the clock signal such that the second latch is closed when the first latch is open and is open when the first latch is closed; and
   a guide logic gate coupling the first clock path of the first stage to the second clock path of the second stage;
      wherein a first input of the guide logic gate is coupled to the first clock path such that the first input of the guide logic gate is coupled to a second input of the final first CGL element;
      wherein a second input of the guide logic gate is coupled to the one or more nodes to receive the clock signal; and
      wherein an output of the guide logic gate is coupled to the second clock path such that the output of the guide logic gate is coupled to a second input of the initial second CGL element to drive the initial second CGL element into pre-charge and evaluate phases.

2. The circuit of claim 1, further comprising:
   one or more additional stages of circuit elements comprising one or more additional CGL elements; and
   one or more additional latches coupled to the one or more additional stages;
   wherein the one or more additional stages are configured in a pipelined configuration such that at least one latch is coupled between consecutive stages.

3. The circuit of claim 1, wherein the initial second CGL element comprises an evaluate-high (EVH) gate;
   wherein final first CGL element comprises an evaluate-low (EVL) gate; and
   wherein the output of the guide logic gate is configured to drive the EVH gate into a pre-charge phase when both following conditions 1) and 2) are present:
      1) the second input of the guide logic gate receives the second phase of the clock signal; and
      2) the first input of the guide logic gate receives a pre-charge phase of a second guide signal, the pre-charge phase of the second guide signal driving the EVL gate into a pre-charge phase; and
   wherein the output of the guide logic gate is configured to drive the EVH gate into an evaluate phase when either of following conditions 3) or 4) is present:
      3) the second input of the guide logic gate receives the first phase of the clock signal; and
      4) the second input of the guide logic gate receives the second phase of the clock signal while the first input of the guide logic gate receives an evaluate phase of the second guide signal, the evaluate phase of the second guide signal driving the EVL gate into an evaluate phase.

4. The circuit of claim 3, wherein the guide logic gate is a NAND gate.

5. The circuit of claim 1, wherein the initial second CGL element comprises an evaluate-low (EVL) gate;
   wherein the final first CGL element comprises an evaluate-high (EVH) gate; and
   wherein the output of the guide logic gate is configured to drive the EVL gate into a pre-charge phase when both following conditions 1) and 2) are present:
      1) the second input of the guide logic gate receives the second phase of the clock signal; and
      2) the first input of the guide logic gate receives a pre-charge phase of a second guide signal, the pre-charge phase of the second guide signal driving the EVH gate into a pre-charge phase; and
   wherein the output of the guide logic gate is configured to drive the EVL gate into an evaluate phase when either following conditions 3) or 4) is present:
      3) the second input of the guide logic gate receives the first phase of the clock signal; and
      4) the second input of the guide logic gate receives the second phase of the clock signal while the first input of the guide logic gate receives an evaluate phase of the second guide signal, the evaluate phase of the second guide signal driving the EVH gate into an evaluate phase.

6. The circuit of claim 5, wherein the guide logic gate is an AND gate having an inverted first input.

7. The circuit of claim 1, wherein the initial second CGL element comprises a first evaluate-high (EVH) gate;
wherein the final first CGL elements comprises a second EVH gate; and
wherein the output of the guide logic gate is configured to drive the first EVH gate into a pre-charge phase when both following conditions 1) and 2) are present:
1) the second input of the guide logic gate receives the second phase of the clock signal; and
2) the first input of the guide logic gate receives a pre-charge phase of a second guide signal, the pre-charge phase of the second guide signal driving the second EVH gate into a pre-charge phase; and
wherein the output of the guide logic gate is configured to drive the first EVH gate into an evaluate phase when either following conditions 3) or 4) is present:
3) the second input of the guide logic gate receives the first phase of the clock signal; and
4) the second input of the guide logic gate receives the second phase of the clock signal while the first input of the guide logic gate receives an evaluate phase of the second guide signal, the evaluate phase of the second guide signal driving the second EVH gate into an evaluate phase.

8. The circuit of claim 7, wherein the guide logic gate is an AND gate having an inverted first input and an inverted output.

9. The circuit of claim 1, wherein the initial second CGL element comprises a first evaluate-low (EVL) gate;
wherein the final first CGL elements comprises a second EVL gate; and
wherein the output of the guide logic gate is configured to drive the first EVL gate into a pre-charge phase when both following conditions 1) and 2) are present:
1) the second input of the guide logic gate receives the second phase of the clock signal; and
2) the first input of the guide logic gate receives a pre-charge phase of a second guide signal, the pre-charge phase of the second guide signal driving the second EVL gate into a pre-charge phase; and
wherein the output of the guide logic gate is configured to drive the first EVL gate into an evaluate phase when either following conditions 3) or 4) is present:
3) the second input of the guide logic gate receives the first phase of the clock signal; and
4) the second input of the guide logic gate receives the second phase of the clock signal while the first input of the guide logic gate receives an evaluate phase of the second guide signal, the evaluate phase of the second guide signal driving the second EVL gate into an evaluate phase.

10. The circuit of claim 9, wherein the guide logic gate is an AND gate.

11. The circuit of claim 1, wherein the initial second CGL element comprises an evaluate-high (EVH) gate; and
wherein the output of the guide logic gate is configured to drive the EVH gate into an evaluate phase when either following conditions 1) or 2) is present:
1) the second input of the guide logic gate receives the first phase of the clock signal; and
2) the second input of the guide logic gate receives the second phase of the clock signal while the first input of the guide logic gate receives an evaluate phase of the second guide signal, the evaluate phase of the second guide signal driving the final first CGL element into an evaluate phase.

12. The circuit of claim 1, wherein the initial second CGL element comprises an evaluate-low (EVL) gate; and
wherein the output of the guide logic gate is configured to drive the EVL gate into an evaluate phase when either following conditions 1) or 2) is present:
1) the second input of the guide logic gate receives the first phase of the clock signal; and
2) the second input of the guide logic gate receives the second phase of the clock signal while the first input of the guide logic gate receives an evaluate phase of the second guide signal, the evaluate phase of the second guide signal driving the final first CGL element into an evaluate phase.

13. The circuit of claim 1, wherein the guide logic gate is configured to trigger a first evaluate edge at the output of the guide logic gate upon arrival of a second evaluate edge at the first input of the guide logic gate;
wherein the first evaluate edge triggers the initial second CGL element to enter an evaluate phase; and
wherein the second evaluate edge triggers the final first CGL element to enter an evaluate phase.

14. The circuit of claim 1, wherein the initial second CGL element comprises an evaluate-high (EVH) gate;
wherein the guide logic gate is configured to drive the EVH gate into a pre-charge phase when both following conditions 1) and 2) are present:
1) the second input of the guide logic gate receives the second phase of the clock signal; and
2) the first input of the guide logic gate receives a pre-charge phase of a second guide signal, the pre-charge phase of the second guide signal driving the final first CGL element into a pre-charge phase.

15. The circuit of claim 1, wherein the initial second CGL element comprises an evaluate-low (EVL) gate; and
wherein the guide logic gate is configured to drive the EVL gate into a pre-charge phase when both following conditions 1) and 2) are present:
1) the second input of the guide logic gate receives the second phase of the clock signal; and
2) the first input of the guide logic gate receives a pre-charge phase of a second guide signal, the pre-charge phase of the second guide signal driving the final first CGL element into a pre-charge phase.

16. The circuit of claim 1, wherein the circuit is an integrated circuit.

17. The circuit of claim 1, wherein the output of the guide logic gate is configured to drive the initial second CGL element into a pre-charge phase when 1) and 2) occur simultaneously:
1) the second input of the guide logic gate receives the second phase of the clock signal; and
2) the first input of the guide logic gate receives a pre-charge phase of a second guide signal, the pre-charge phase of the second guide signal driving the final first CGL element into a pre-charge phase; and
wherein the output of the guide logic gate is configured to drive the initial second CGL element into an evaluate phase when either 3) or 4) occur:
3) the second input of the guide logic gate receives the first phase of the clock signal; and
4) the second input of the guide logic gate receives the second phase of the clock signal while the first input of the guide logic gate receives an evaluate phase of the second guide signal, the evaluate phase of the second guide signal driving the final first CGL element into an evaluate phase.

18. The circuit of claim 1, wherein a first signal path of the first stage comprises a first input of each first CGL element and an output of each first CGL element;
wherein a second signal path of the second stage comprises a first input of each of the second CGL elements and an output of each of the second CGL elements;
wherein the first latch is coupled to the first stage such that an input of the first signal path of the first stage is coupled to the data output of the first latch; and
wherein the second latch is coupled to the first stage and to the second stage such that an output of the first signal path of the first stage is coupled to the data input of the second latch, and such that the data output of the second latch is coupled to an input of the second signal path of the second stage.

* * * * *